United States Patent
Jayakumar et al.

(10) Patent No.: US 10,591,902 B2
(45) Date of Patent: Mar. 17, 2020

(54) MICROCONTROLLER ENERGY MANAGEMENT SYSTEM

(71) Applicant: Purdue Research Foundation, West Lafayette, IN (US)

(72) Inventors: Hrishikesh Jayakumar, West Lafayette, IN (US); Arnab Raha, West Lafayette, IN (US); Vijay Raghunathan, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/397,721

(22) Filed: Jan. 3, 2017

(65) Prior Publication Data

US 2017/0343987 A1    Nov. 30, 2017

Related U.S. Application Data

(60) Provisional application No. 62/274,363, filed on Jan. 3, 2016.

(51) Int. Cl.
*G06F 11/14* (2006.01)
*G05B 19/418* (2006.01)
(Continued)

(52) U.S. Cl.
CPC ........... *G05B 19/418* (2013.01); *G01D 21/02* (2013.01); *G01R 22/06* (2013.01); *G05B 19/404* (2013.01);
(Continued)

(58) Field of Classification Search
CPC .................. G06F 11/1441; G06F 11/1446
See application file for complete search history.

(56) References Cited

U.S. PATENT DOCUMENTS

| 5,884,077 A * | 3/1999 | Suzuki | G06F 9/505 718/103 |
| 9,093,160 B1 * | 7/2015 | Ellis | G11C 16/10 |

(Continued)

OTHER PUBLICATIONS

Jayakumar, H., "Powering the Internet of Things". In Proc. of ISLPED, 2014, pp. 375-380.
(Continued)

*Primary Examiner* — Yolanda L Wilson
(74) *Attorney, Agent, or Firm* — Purdue Research Foundation

(57) ABSTRACT

A microcontroller system which employs an intermediate approach in hybrid FRAM-SRAM that involves memory mapping of program sections to retain the reliability benefits provided by FRAM while performing almost as efficiently as an SRAM-based system. They system utilizes an energy-aware memory mapping method which maps different program sections to the hybrid FRAM-SRAM MCU such that energy consumption is minimized without sacrificing reliability. The method comprises a memory initialization map, which performs a one-time characterization to find the optimal memory map for the functions that constitute a program. The method further comprises an energy alignment, a hardware/software method that aligns the system's powered-on time intervals to function execution boundaries, which results in further improvements in energy efficiency and performance.

4 Claims, 14 Drawing Sheets

(51) Int. Cl.
*G05B 19/414* (2006.01)
*G05B 19/404* (2006.01)
*G01D 21/02* (2006.01)
*G01R 22/06* (2006.01)
*G05B 23/02* (2006.01)

(52) U.S. Cl.
CPC ..... *G05B 19/4142* (2013.01); *G05B 23/0297* (2013.01)

(56) References Cited

U.S. PATENT DOCUMENTS

| | | | | |
|---|---|---|---|---|
| 2002/0144019 | A1* | 10/2002 | Gooding | G06F 9/547 719/330 |
| 2007/0112889 | A1* | 5/2007 | Cook | G06F 17/30412 |
| 2013/0254457 | A1* | 9/2013 | Mukker | G06F 11/1441 711/103 |
| 2014/0018097 | A1* | 1/2014 | Goldstein | G06F 19/00 455/456.1 |
| 2014/0059311 | A1* | 2/2014 | Oberhofer | G06F 3/061 711/162 |
| 2014/0075218 | A1 | 3/2014 | Bartling et al. | |
| 2014/0075225 | A1 | 3/2014 | Bartling et al. | |
| 2014/0075232 | A1 | 3/2014 | Bartling et al. | |
| 2014/0075233 | A1 | 3/2014 | Bartling et al. | |
| 2014/0181595 | A1* | 6/2014 | Hoang | G06F 11/3034 714/47.3 |
| 2014/0325116 | A1* | 10/2014 | McKelvie | G06F 12/0246 711/103 |
| 2016/0350028 | A1* | 12/2016 | Lesartre | G06F 12/08 |

OTHER PUBLICATIONS

Lu, C., "Micro-scale energy harvesting: A system design perspective", In Proc. of ASP-DAC, pp. 89-94, Jan. 2010.
Khanna, S., "An FRAM-Based Nonvolatile Logic MCU SoC Exhibiting 100% Digital State Retention at VDD= 0 V Achieving Zero Leakage With < 400-ns Wakeup Time for ULP Applications", IEEE JSSC, pp. 95-106, 2014.
Wang, Y., "A 3us wake-up time nonvolatile processor based on ferroelectric flip-flops", In Proc. of ESSCIRC '12, pp. 149-152.
Sakimura, N., "10.5 A 90nm 20MHz fully nonvolatile microcontroller for standby-power-critical applications", In Proc. of IEEE ISSCC 2014, pp. 184-185.
Jayakumar, H., "Quickrecall: A hw/sw approach for computing across power cycles in transiently powered computers", J. Emerg. Technol. Comput. Syst., 12(1):8:1-8:19, 2015.
Texas Instruments. MSP430FR573x Mixed-Signal Microcontrollers.
Ransford, B., "Mementos: System Support for Long-runningComputation on RFID-scale Devices", In Proc. of ASPLOS XVI, pp. 159-170, 2011.
Balsamo, D., "Hibernus: Sustaining Computation During Intermittent Supply for Energy-Harvesting Systems", Embedded Systems Letters, IEEE, pp. 15-18, 2015.
Lucia, B., "A simpler, safer programming and execution model for intermittent systems", In Proc. of the 36th ACM SIGPLAN PLDI, pp. 575-585, 2015.

* cited by examiner (a) Rank ordering of different memory-map configurations (b) Normalized energy consumption of different function configurations for AES (c) Speed-up comparison normalized to Quickrecall

MICROCONTROLLER ENERGY MANAGEMENT SYSTEM

CROSS REFERENCE TO RELATED APPLICATIONS

The present U.S. patent application is related to and claims the priority benefit of U.S. Provisional Patent Application Ser. No. 62/274,363, filed Jan. 3, 2016, the contents of which are hereby incorporated by reference in their entirety into the present disclosure.

STATEMENT REGARDING GOVERNMENT FUNDING

This invention was made with government support under CNS-0953468 and CCF-1018358 awarded by the National Science Foundation. The government has certain rights in the invention.

TECHNICAL FIELD

The present application relates to computer microcontroller systems, and more specifically, to an energy management system for Internet of Things (IoT) devices.

BACKGROUND

The advent of the Internet of Things (IoT) era has fueled the emergence of new applications that improve various aspects of everyday human life. An ever-increasing number and type of IoT sensors (herein referred to as edge devices) are being deployed to seamlessly bridge the physical world with the world of computing infrastructure. However, powering such deeply-embedded IoT edge devices is extremely challenging due to their unique constraints such as remote deployment location, tiny form factor, and extreme longevity requirements. Environmental energy harvesting (where the system powers itself using energy that it scavenges from its operating environment) has been shown to be a promising and viable option for powering these IoT devices. However, ambient energy sources (such as vibration, wind, RF signals) are often unreliable and intermittent in nature, which can lead to frequent intervals of power loss. Performing computations reliably in the face of such power supply interruptions is challenging and requires some form of checkpointing of system state from static random access memory (SRAM) to non-volatile memory when power loss is imminent. Traditionally, microcontrollers have employed flash memory as the primary non-volatile storage technology. However, the energy (and latency) intensive erase/write operations of flash memory make it inefficient for frequent checkpointing.

The emergence of non-volatile memory technologies such as ferroelectric RAM (FRAM) and magnetoresistive RAM (MRAM), which have superior power and performance characteristics compared to flash memory, has led to new hybrid memory architectures. Low power microcontrollers (MCUs) that integrate FRAM and MRAM have been demonstrated in the field. Recent work has also shown that the use of FRAM as unified memory (where all program segments including text, stack, data, etc., are mapped to the FRAM) enables efficient in-situ checkpointing in IoT devices, thereby allowing them to seamlessly perform long-running computations in the face of frequent power loss. Even though FRAM outperforms flash in terms of performance and power consumption, it is still inferior to SRAM due to inherent device limitations. For example, in Texas Instrument's model MSP430FR5739 microcontroller, accesses to FRAM are 3× slower and consume more energy as compared to SRAM. Therefore, executing programs from FRAM results in lower performance and higher energy consumption, compared to executing programs from SRAM. On the other hand, an entirely SRAM-based solution is highly energy efficient when running continuously on reliable power, but is unreliable in the face of power loss because SRAM is volatile. Therefore, improvements are needed in the field.

SUMMARY

The present disclosure provides a microcontroller system which employs an intermediate approach in hybrid FRAM-SRAM that involves memory mapping of program sections to retain the reliability benefits provided by FRAM while performing almost as efficiently as an SRAM-based system. They system utilizes an energy-aware memory mapping method which maps different program sections to the hybrid FRAM-SRAM MCU such that energy consumption is minimized without sacrificing reliability. The method comprises a memory initialization map (also referred to herein as eM-map), which performs a one-time characterization to find the optimal memory map for the functions that constitute a program (this makes the system portable across platforms). The method further comprises an energy alignment (also referred to herein as energy-align), a hardware/software method that aligns the system's powered-on time intervals to function execution boundaries, which results in further improvements in energy efficiency and performance.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 8A depicts rank ordering of different memory-map configurations according to one embodiment.

FIG. 8B depicts normalized energy consumption of different function configurations for AES.

FIG. 8C depicts a speed-up comparison normalized to Quickrecall.

FIG. 9 shows energy reduction across applications.

The attached drawings are for purposes of illustration and are not necessarily to scale.

DETAILED DESCRIPTION

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Checkpointing is an approach to solving the problem of performing computations reliably and energy efficiently in IoT edge devices that have an unstable power supply. Checkpointing systems generally save a snapshot of the system state, which consists of stack, data, processor registers, etc., to non-volatile memory before power is lost. When the system receives power again, the saved snapshot is restored, thus enabling computations to continue across power cycles. A checkpoint operation is performed when the system detects that the energy remaining is less than a pre-defined threshold. This threshold is determined by the total energy required to complete a successful checkpoint (Eckpt), which is given by the equation below.

$$E_{ckpt} = E_{byte} \times N_{bytes} \quad (1)$$

The energy required to checkpoint a byte of data (Ebyte) varies with the kind of non-volatile memory technology in use. The number of bytes to be checkpointed ($N_{bytes}$) for a particular program varies due to the dynamic nature of stack and heap depths during program execution.

The present disclosure provides a system which dynamically maps frequently executed computational kernels and associated data to the SRAM, resulting in performance and energy benefits.

Figure 1A:
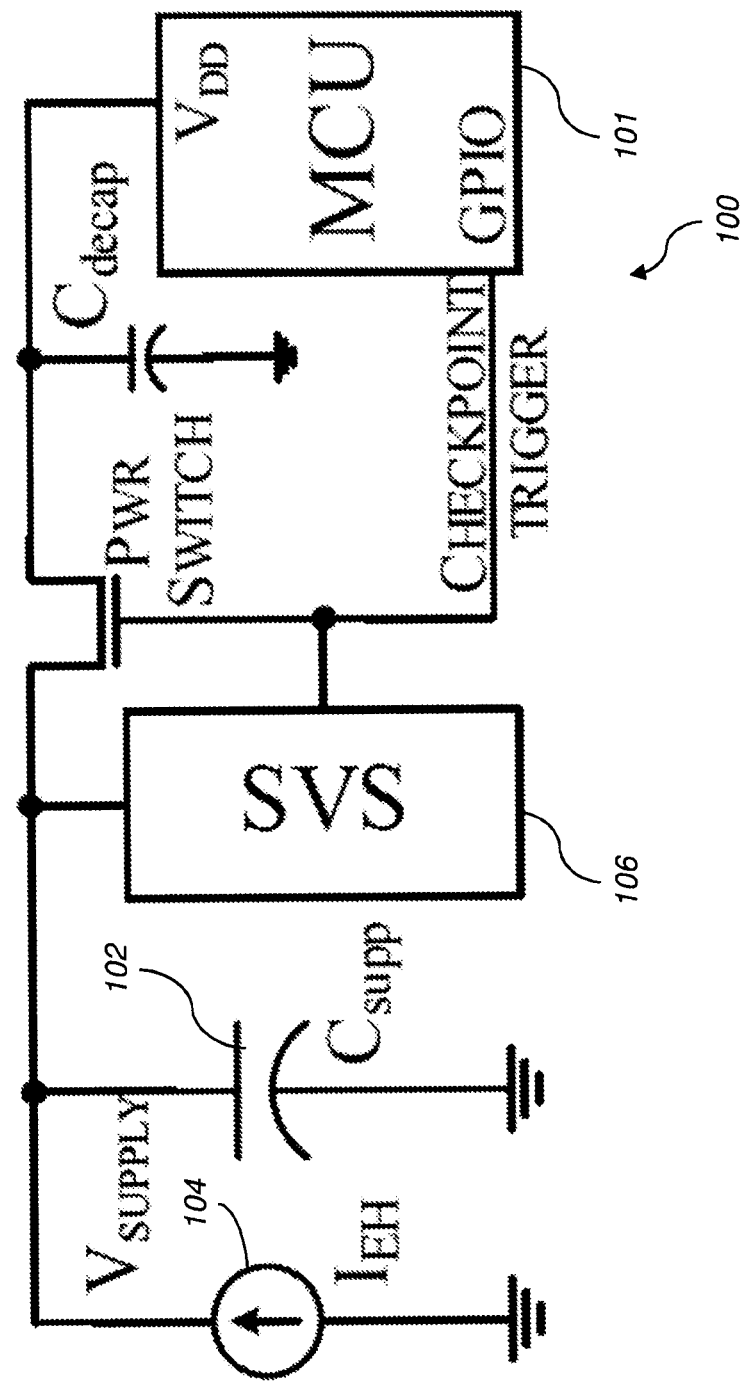
FIG. 1A depicts power supply architecture of an energy harvesting IoT device according to one embodiment.
Figure 1B:
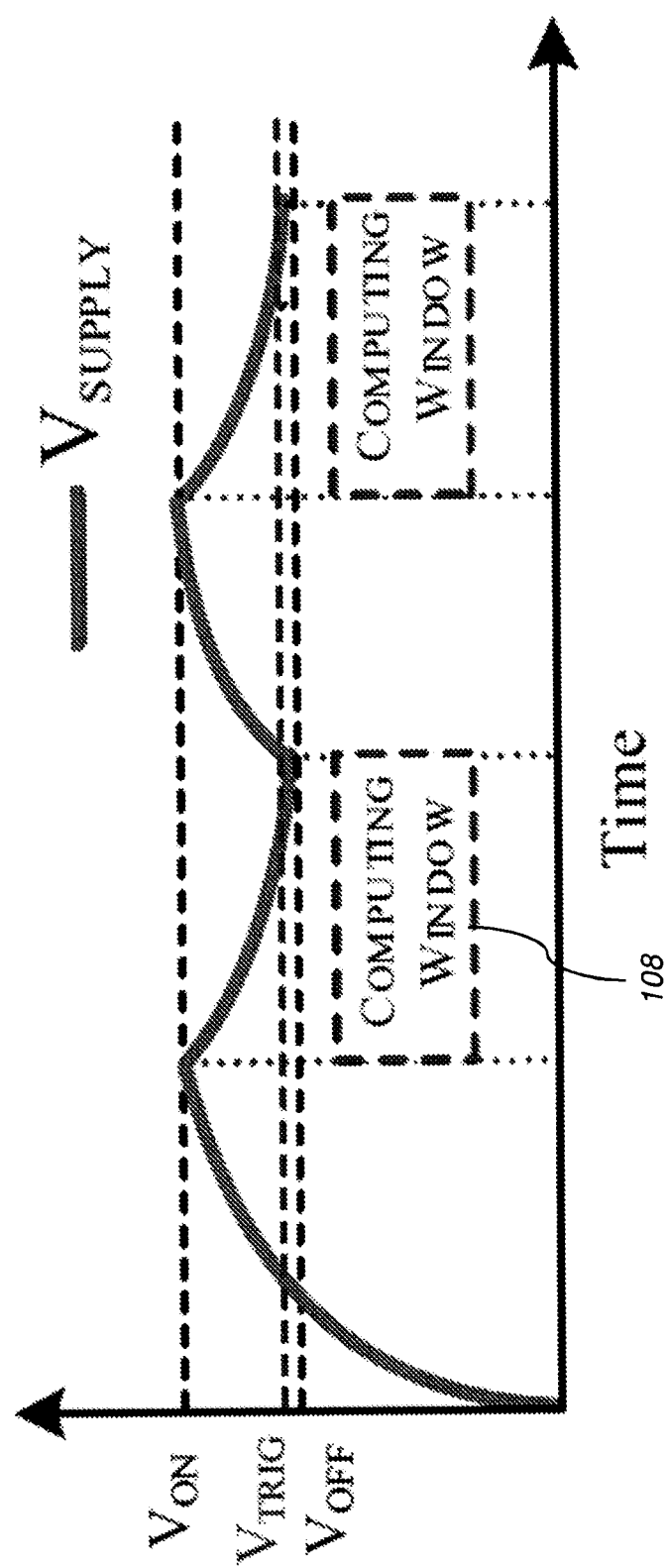
FIG. 1B depicts a voltage profile for the system of FIG. 1A according to one embodiment.

As mentioned above, an important feature of IoT edge devices operating with an unreliable power supply is the ability to detect and respond to interruptions in their power supply. FIG. 1A shows an example power supply architecture of an IoT device 100 having a microcontroller unit (MCU) 101. FIG. 1B illustrates a conceptual supply voltage profile that shows the typical operating stages of the IoT device 100 under unstable supply voltage. As shown, a capacitor (Csupp) 102 collects the energy harvested by an energy harvester module 104 from an ambient source (e.g., heat from the surrounding environment). The current from the energy harvesting module 104 is represented by $I_{EH}$ in FIG. 1A. Once enough energy has been gathered ($V_{ON}$), a supply voltage supervisor (SVS) module 106 connects capacitor 102 to a target system, which subsequently performs the relevant computations. This is depicted as the computing window 108 in FIG. 1b. An important characteristic of these devices is that $I_{EH} \ll I_{system}$ due to IoT devices being required to be inconspicuous and of small form-factor. The system voltage continues to drop rapidly as execution progresses until capacitor 102 discharges to the trigger voltage ($V_{TRIG}$), upon which an interrupt is triggered to checkpoint the system state. Note that enough margin is built into $V_{TRIG}$ to satisfy a successful checkpoint. The process repeats with capacitor 102 getting charged from the energy harvesting module 104. This implies that at the beginning of every power cycle, the device 100 is guaranteed an energy supply of $\frac{1}{2}C_{supp}(V_{ON}^2 - V_{TRIG}^2)$ agnostic to the modality and variations in energy harvesting. An important observation is that the applications that are run on such systems exhibit a deterministic nature in their execution flow. The typical execution flow in the IoT device involves making a sensor measurement of a physical phenomenon (e.g., temperature, humidity, etc.) by collecting a fixed number of samples, performing computations on the collected data (e.g., filtering, statistical computations such as mean, standard deviation, etc.) that take a deterministic and constant amount of clock cycles, and then transmitting it for further actuation or logging depending upon the energy remaining in the system. Such a simplistic software design results in the absence of run-to-run variations in execution times, data sizes, etc., thus making them predictable and deterministic. The present disclosure leverages this knowledge to propose an energy-aware memory mapping.

Although FRAM is better than flash by having lesser write energy and lacking an explicit erase operation, it compares poorly to SRAM in terms of access latency. In one example FRAM-enabled MCU, model MSP430FR5739, it was experimentally observed that the FRAM access latency is 3× longer as compared to the on-chip SRAM. Consequently, a unified-FRAM memory architecture will result in longer execution times. To quantify the impact that memory-mapping has on execution energy and latency, an experiment was performed using the MSP430FR5739 MCU that includes 1 KB of SRAM and 16 KB of FRAM.

Two cyclic redundancy checksum (CRC) functions were considered for evaluation and are described below. Both the functions compute the 16-bit CRC of 64 bytes of data. CRC-I looks up a 512-byte static table for computing the checksum and has a large memory footprint. CRC-I has three different sections that are of interest, namely, a text section that contains the executable code, a data section that contains the look-up table, and the stack. On the other hand, CRC-II computes CRC using polynomials and uses only the text and stack sections. For both the programs, each section was iteratively mapped to both FRAM and SRAM, and the energy required and execution time was measured.

Figure 2A:
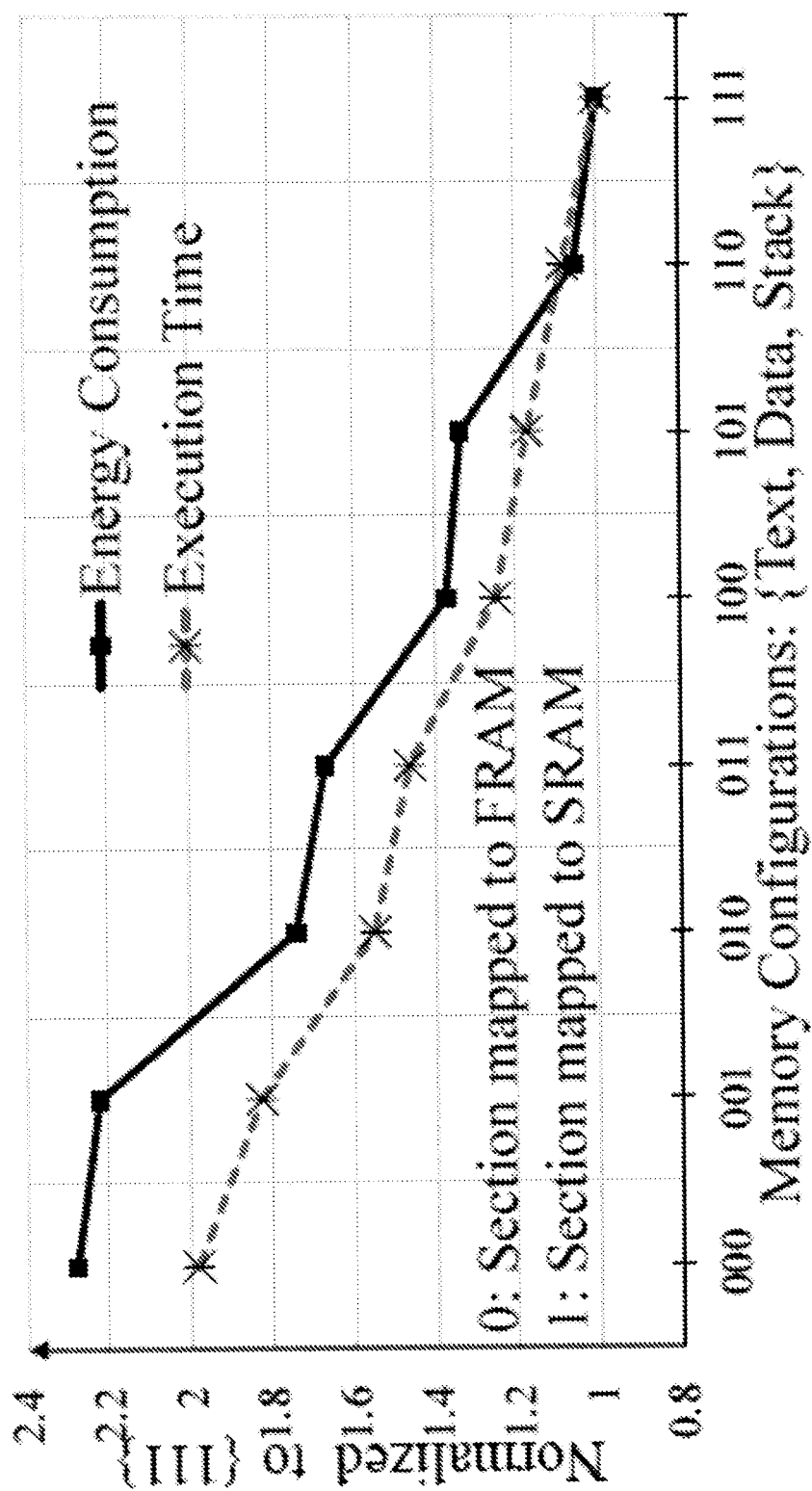
FIG. 2A depicts energy consumption for the CRC-I function of the system of FIG. 1A according to one embodiment.
Figure 2B:
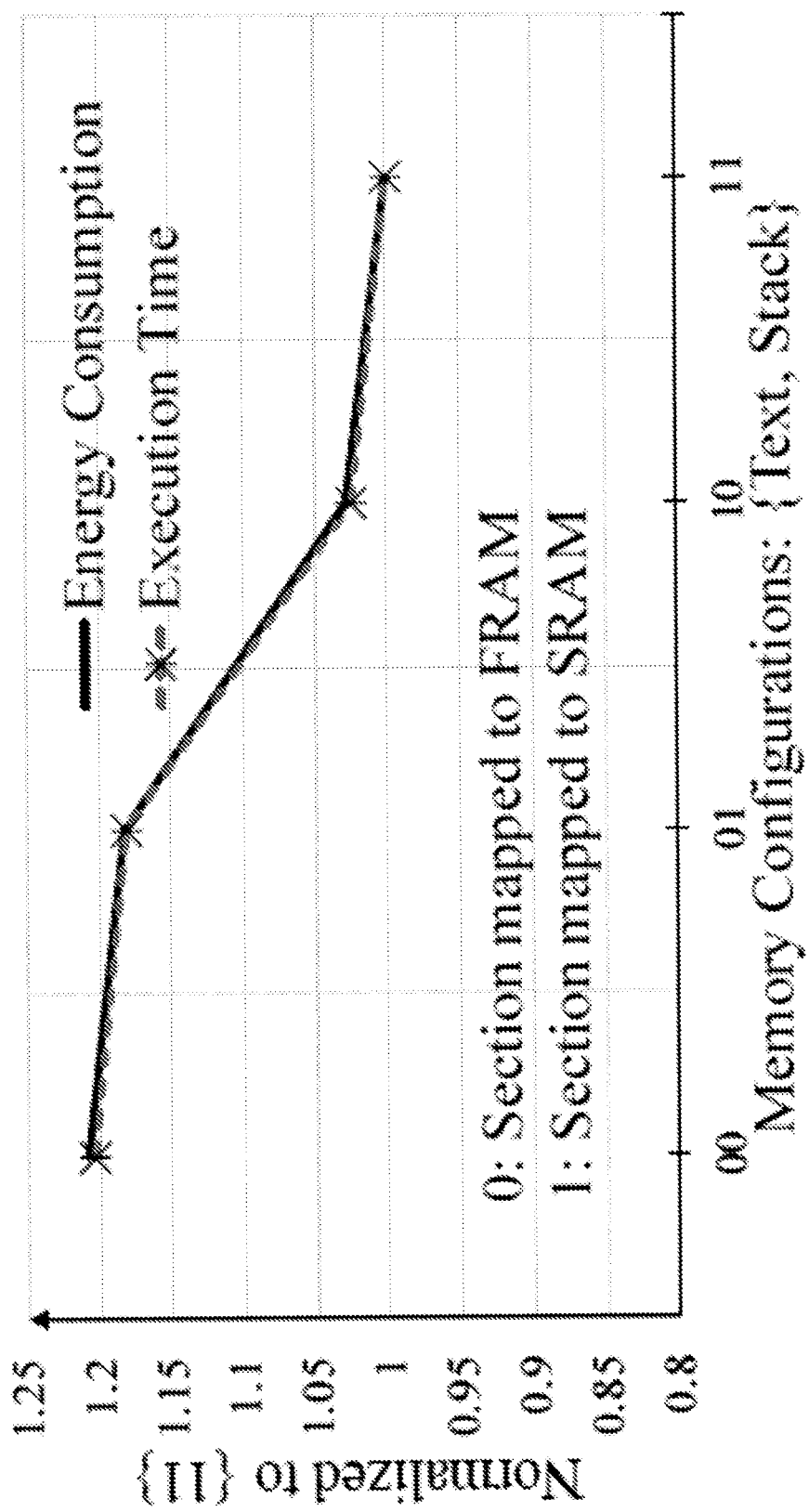
FIG. 2B depicts energy consumption for the CRC-II function of the system of FIG. 1A according to one embodiment.

FIGS. 2A and 2B show the measured energy consumption and latency associated with each memory mapping for executing CRC-I and CRC-II respectively. The memory mapping is represented in binary format with the text section as the Most Significant Bit (MSB), followed by data and stack sections. A "1" signifies that the section is mapped onto SRAM whereas a "0" indicates a mapping to the FRAM. For example, configuration {101} in FIG. 2A signifies that the text and stack sections of CRCI are mapped onto the SRAM and that the data section is mapped onto the FRAM. Observe that for both the programs, a unified SRAM mapping results in the least energy consumption while a unified FRAM mapping results in the maximum energy consumption. Overall, we note that for both CRC-I and CRC-II, any of the SRAM-mapped configurations consume less energy (by as much as 2.28×) and execute faster (by as much as 1.98×) as compared to the unified FRAM configuration. However, additional data transfer operations are required to ensure system reliability and continuity of program execution across power cycles when operating in an SRAM mapped configuration. Hence, a trade-off exists between the data transfer cost and the execution cost. Thus, an optimal memory map configuration may lie in between an FRAM-only approach (that has the maximum execution energy but least data transfer overhead) and an SRAM-only configuration (that has the least execution energy but maximum data transfer overhead). The system of the present disclosure determines the optimal memory map configuration that minimizes the overall energy cost for IoT edge devices without sacrificing reliability.

Figure 3:
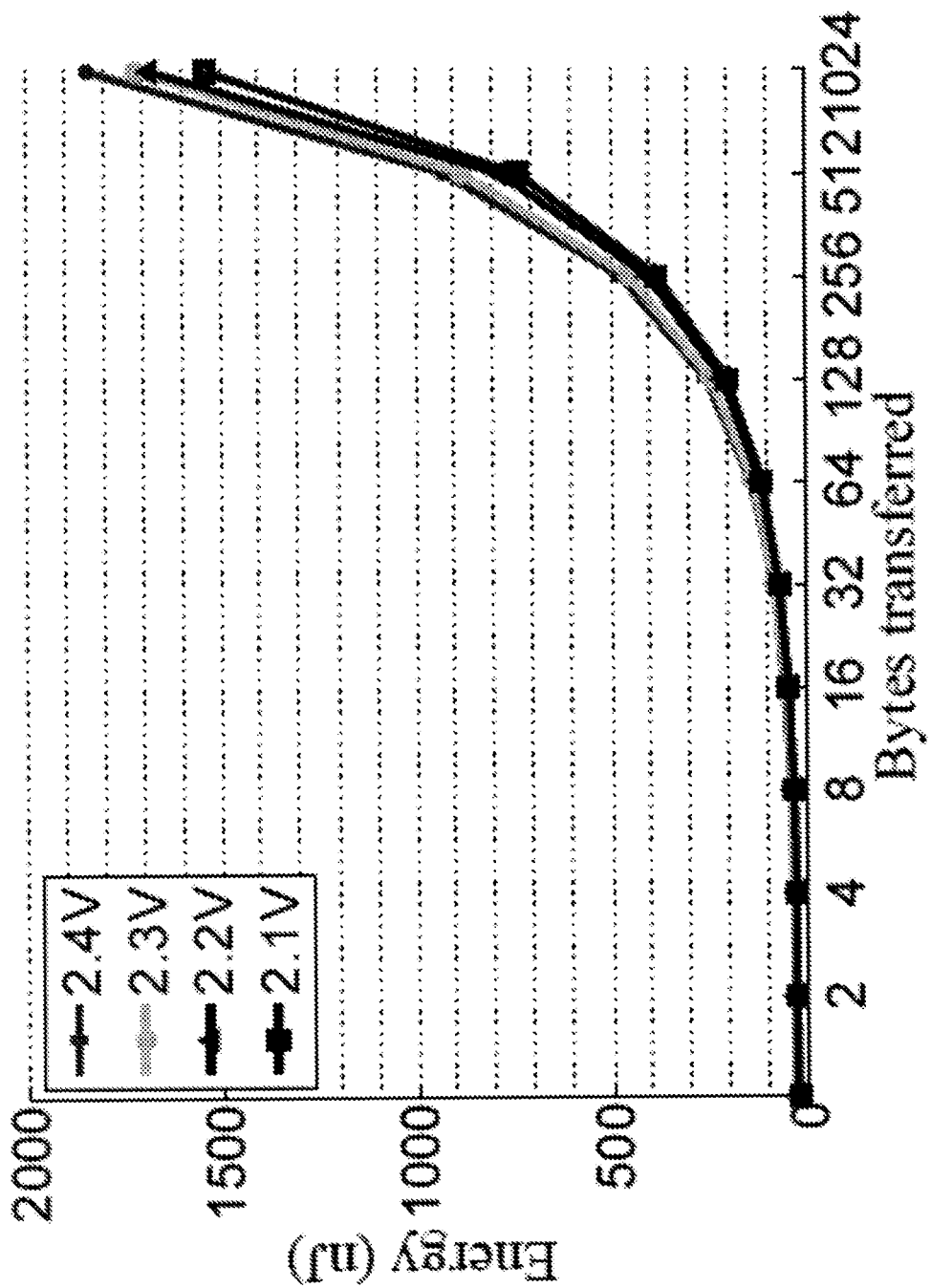
FIG. 3 depicts migration overhead a of the system of FIG. 1A according to one embodiment.

Determining the optimal memory-map configuration for a program is challenging due to two reasons, namely, the data transfer overhead and diverse nature of applications. The data transfer overhead originates from the processes of migration and checkpointing. Migration overhead is best described as the energy incurred in transferring sections from FRAM to SRAM. For example, if the considered function has the least energy consumption in configuration {100}, the executable code that resides in the nonvolatile memory initially needs to be migrated to SRAM. Migration overhead is function-dependent (e.g., CRC-II does not use the table thus having a smaller migration overhead) and application-dependent (e.g., the same function may have different input data sets when called from two locations in the program). FIG. 3 shows the measured energy overhead for migration as a function of the number of bytes to be migrated, for supply voltages ranging from 2:1 V to 2:4 V. From the graph, we observe that migration incurs ~1:6 nJ per byte of data transferred from FRAM to SRAM. Also, observe that the difference in migration overhead is negligible across the range of supply voltages used in the experiment. Therefore, migrating a section t any stage in the computing window (FIG. 1B) incurs comparable costs.

Checkpointing, in the context of the present disclosure, is the process of saving the system state from SRAM to FRAM. Our experiments show that the energy per byte cost of checkpointing is similar to that of migration. However, checkpoint energy is non-deterministic due to the dynamic nature of stack and heap sizes, as mentioned in above. An incomplete checkpoint results if the available energy is insufficient to save a full snapshot of the system state on an imminent power loss, leading to a loss or corruption in system state. The energy spent in executing the program in such a scenario is wasted and additional energy needs to be spent in program re-execution subsequently. Further, the system loses reliability in such scenarios. On the other hand, making an overly conservative estimate of the checkpoint energy will lead to under-utilization of the available energy and cause wastage. Therefore, a deterministic policy that accurately estimates the checkpoint energy per configuration is needed in deciding the optimal memory-map for each function.

Lastly, the diversity in IoT device characteristics introduces another dimension of complexity in determining the optimal configuration for the memory mapping of a function across platforms. For example, a different value for Csupp could make the CRC-I function run to completion in a single power cycle in one IoT device but take multiple power cycles in another for the same memory-map configuration. This renders generalizing a particular configuration as an optimal memory map impossible, affecting program portability.

The non-determinism and inefficiency associated with mapping sections to SRAM can be primarily attributed to the unpredictability in checkpoint size. It also impacts the choice of the trigger voltage, as explained above. While in the {111} configuration, if the system is about to lose power, the stack and data sections need to be copied over. IoT applications rarely consist of self-modifying code and, therefore, the need for checkpointing the text section that had been migrated to SRAM is an uncommon case. Thus, the main goal of our proposed design is to reduce the nondeterminism associated with the checkpoint operation, and to improve the overall performance.

Figure 4A:
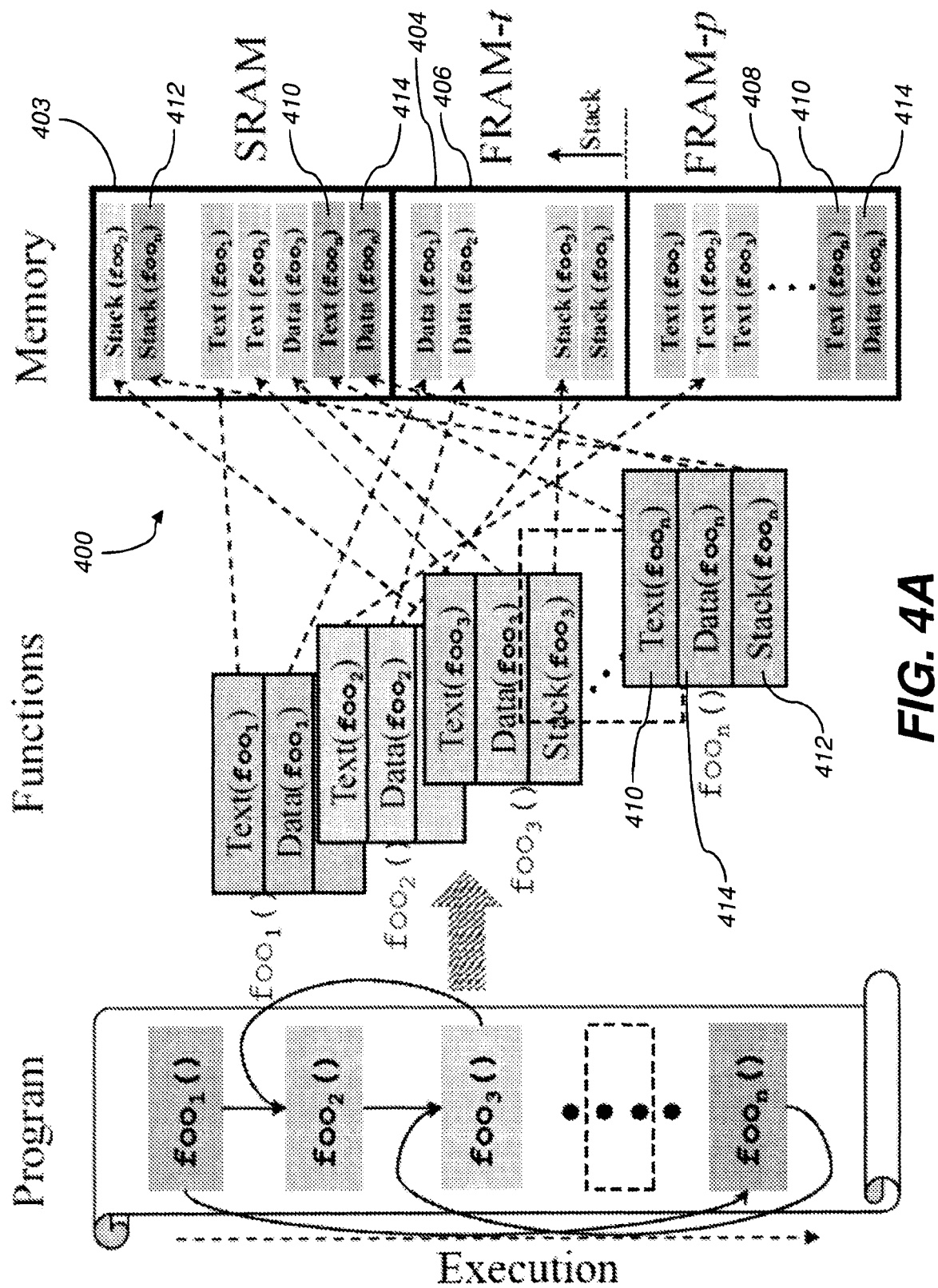
FIG. 4A depicts a memory mapping for hybrid FRAM-SRAM MCUs of the system of FIG. 1A according to one embodiment.
Figure 4B:
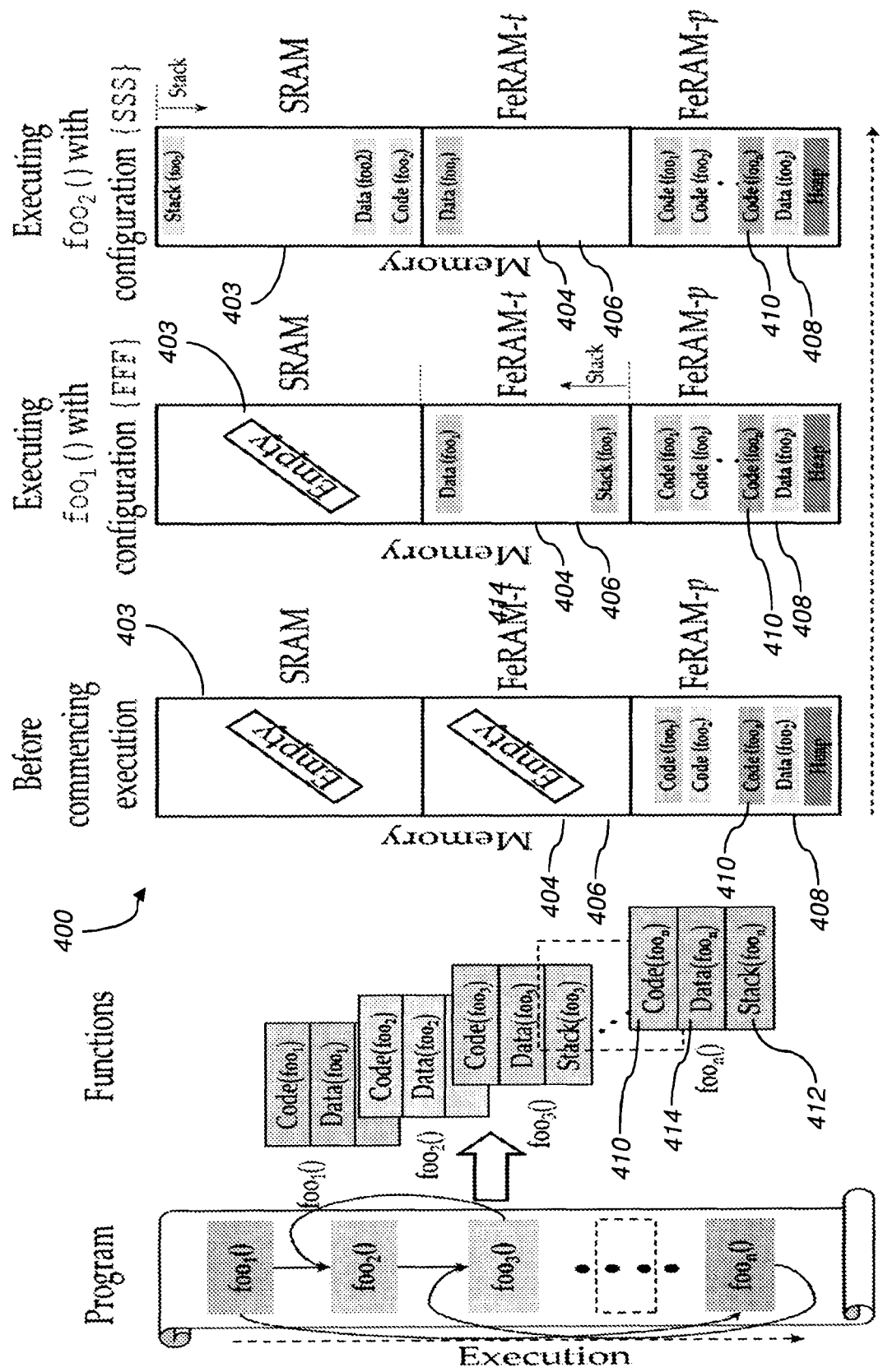
FIG. 4b depicts a memory mapping diagram showing additional timing details for hybrid FRAM-SRAM MCUs of the system of FIG. 1A according to one embodiment.

Program functions are self-contained in terms of their sections. A function can be considered to be an independent entity having its own text, data, and stack sections that can be mapped onto memory at runtime. Moreover, a function also has the property that its stack ceases to exist upon returning to its caller. Therefore, performing a checkpoint at the end of a function, at its boundary, reduces the amount of data that needs to be checkpointed, which, in turn, decreases the non-determinism. According to one embodiment, the system of the present disclosure performs checkpoints only at these boundaries where the checkpoint size is reduced and deterministic. FIGs. 4A and 4B illustrates the overall approach wherein each function $foo_n(\ )$ in a program 402 is an independent entity that can be mapped to either FRAM or SRAM.

FIGs. 4A and 4B also shows the memory system 400 for a hybrid FRAM-SRAM microcontroller according to one embodiment. The system 400 includes SRAM 403 and non-volatile FRAM 404. The non-volatile FRAM memory 404 is partitioned into two distinct regions, namely, FRAM-p (406) and FRAM-t(408). FRAM-p (406) is the memory space where persistent data such as the text section 410, constants, etc. are stored. FRAM-t (408) defines the space where a function can map temporary sections such as stack 412 and data 414 as dictated by the memory-map configuration during function execution, i.e., FRAM-t (408) acts as a slower but nonvolatile RAM. Note that no section is mapped to the SRAM 403 initially. As the program executes, different functions can dynamically allocate sections onto the SRAM 403. Since each function is handled as an independent entity, sections that are mapped onto the SRAM 403 become invalid once the function runs to completion. The text section 410 has a fixed size and therefore occupies a first end of the address space. On the other hand, the stack section grows and shrinks during the course of function-execution and, hence, occupies the other end of the SRAM address space. The data section occupies the address space adjacent to the text section in SRAM. Note that in spite of such an arrangement, the sections may still collide during execution depending on the total SRAM capacity and section sizes. In such a case, the memory-map configuration is invalid (and disallowed) as the function can never complete correctly in this configuration.

While arriving at the optimal memory map for a particular function, the energy consumption for performing the processes of migration, function-execution, and checkpointing should be considered together. The optimal memory map is one that can perform the three operations within a single power cycle with the least amount of energy. However, functions may exist that cannot complete within a single power cycle for any configuration. In such a case, for the sake of reliability, it is safe to execute the function with a unified FRAM configuration, even though it might not be energy-optimal. In one embodiment of the present disclosure, a characterization step (referred to herein as eM-map) is implemented which determines the optimal memory map for each function as described in Table 1 (Process 1) below. Additionally, by executing eM-map after deployment, it ensures that the memory-map is optimized for the particular IoT edge device.

TABLE 1

Process 1: eM-map: Energy-Aware Memory Mapping

1: Input: C($F_i$): Configuration set for each function $F_i$
2: Output: M($F_i$): Preferred configuration for each function $F_i$
3: Output: E($F_i$): Energy table for all functions
4: Pick a configuration c from C($F_i$)
5: C($F_i$) = C($F_i$) − c
6: Vinit = measure voltage( )
7: Migrate($F_i$, c)
8: Execute($F_i$)
9: Checkpoint($F_i$, c)
10: Vfinal = measure voltage( )
11: energy = f($V_{init}$, $V_{final}$)
12: Update energy table($F_i$, energy)
13: Update preferred config($F_i$, c)
14: Shutdown( )

A brief description of the process of Table 1 follows. eM-map successively iterates through all possible configurations for a function to arrive at the energy-optimal configuration. The default memory map assignment is set to be configuration {000}, which corresponds to the unified FRAM case (text, data, and stack stored in FRAM). Each iteration begins with capacitor 102 (Csupp) charged until $V_{ON}$ is reached. A memory map then assigned to the function and it performs the processes of migration, execution, and checkpointing, and measures the cumulative energy consumed for all three stages. A memory map is considered valid only if the function successfully completes execution in that power cycle. At the end of each iteration, eM-map updates a table with the minimum energy configuration for the considered function. However, if all the configurations for a function become invalid, eM-map chooses {000} as the optimal memory map.

Once all the functions in the program have been characterized, the process outputs the selected configuration for each of them in an energy table comprising the configuration and its corresponding energy. This table is used at run time for allocating sections to SRAM or FRAM. Thus, by performing the characterization once for a device, at the granularity of functions and only a single configuration per power cycle, eM-map is able to find the optimal memory-map regardless of the non-deterministic nature of the data transfer overheads and agnostic to the system parameters.

In certain embodiments, a run-time process (referred to herein as Energy-Align) is utilized by the system of the present disclosure that improves the energy efficiency of IoT devices by reducing the charging interval in between power cycles. A key concept of the run-time process is that it allows the execution of function in the program flow only if the system has sufficient energy to complete it. The characterization information from eM-map (Process 1) is used to predict whether the subsequent function can be successfully completed in the current power cycle. The run-time process is described in Table 2 below. Such an approach facilitates in reducing the energy consumption in two ways. First, by ensuring that migration, execution, and checkpointing of the function happen together in the same power cycle, the run-time process avoids conservative worst-case checkpoint design approaches. In one example, the trigger voltage is kept at 2.03 V, which is the same as that of Quickrecall. The run-time process will get triggered for a checkpoint at this voltage only if it runs the function in configuration {000}. For all other configurations, checkpointing happens at function boundaries. Second, by powering the system off early, the run-time process reduces the charging time for the supply capacitor 102 to charge back up to $V_{ON}$. Thus, the run-time process executes the function in an energy-aware manner.

TABLE 2

Process 2: Energy-Align

1: Input: Energy Table: E($F_i$)
2: Input: Memory Map Table M($F_i$)
3: Input: FC = Current Function
4: while M(FC) is not (All FRAM) do
5: $E_{rem}$ = measure energy( )
6: if $E_{rem}$ > E(FC) then
7: Migrate(M(FC), FC)
8: Execute(TC)
9: Checkpoint(M(FC), FC)
10: FC = Next Function
11: else
12: Shutdown( )
13: end if
14: end while
15: Enable in-situ checkpointing
16: Execute(FC)
17: FC = Next Function
18: Jump to Line 1

Figure 5A:
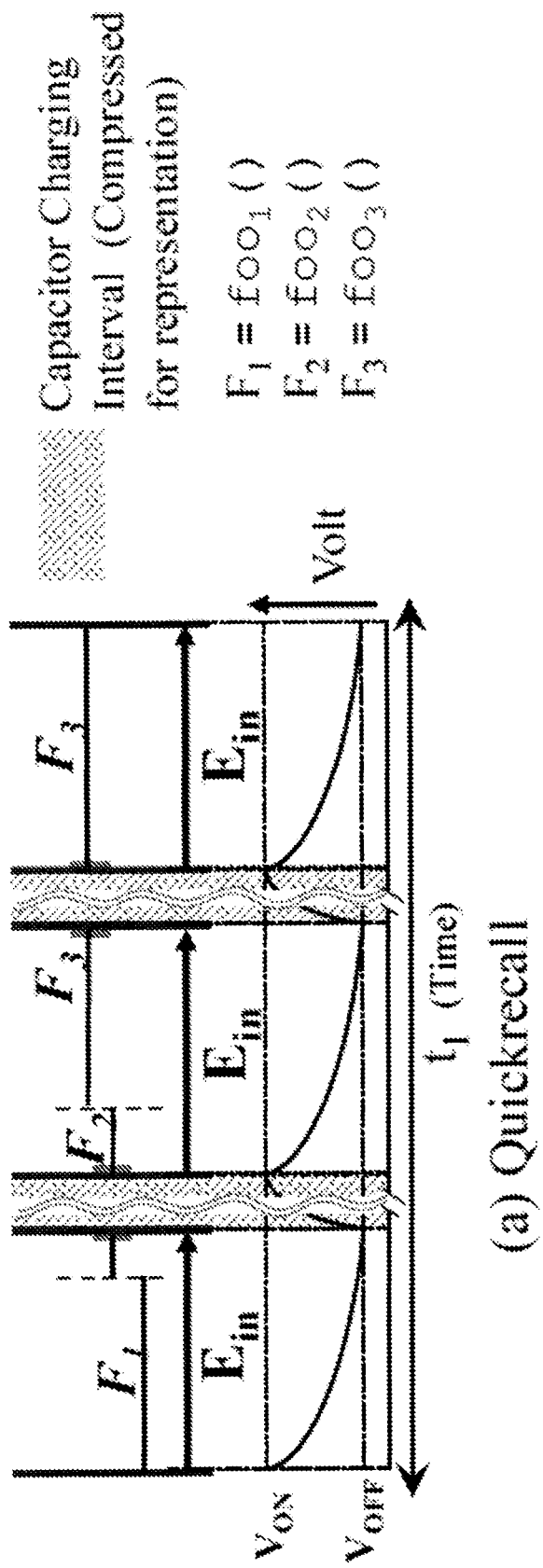
FIG. 5A depicts function-execution across power cycles for Quickrecall.
Figure 5B:
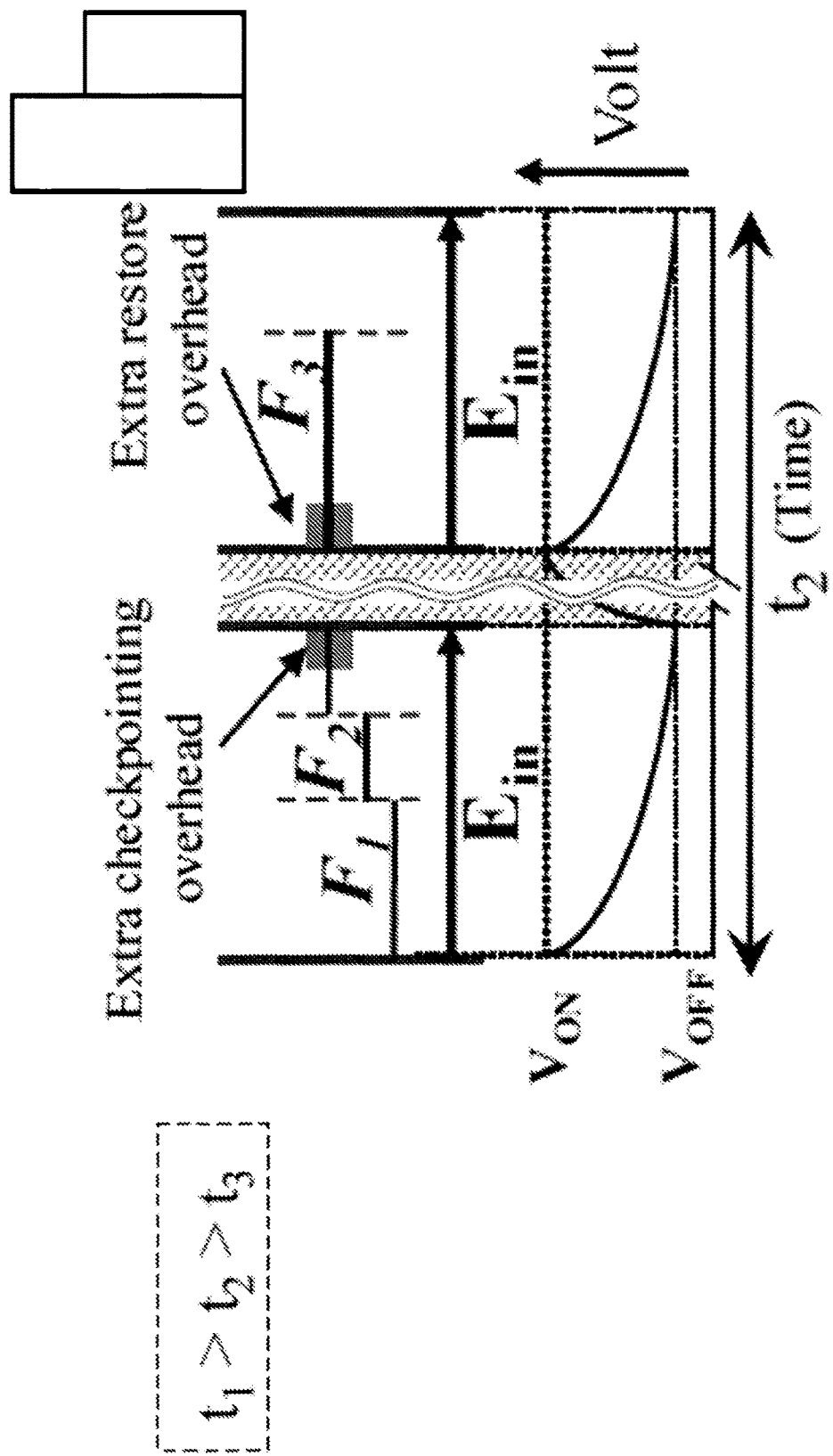
FIG. 5B depicts function-execution across power cycles for Lazy-ckpt.
Figure 5C:
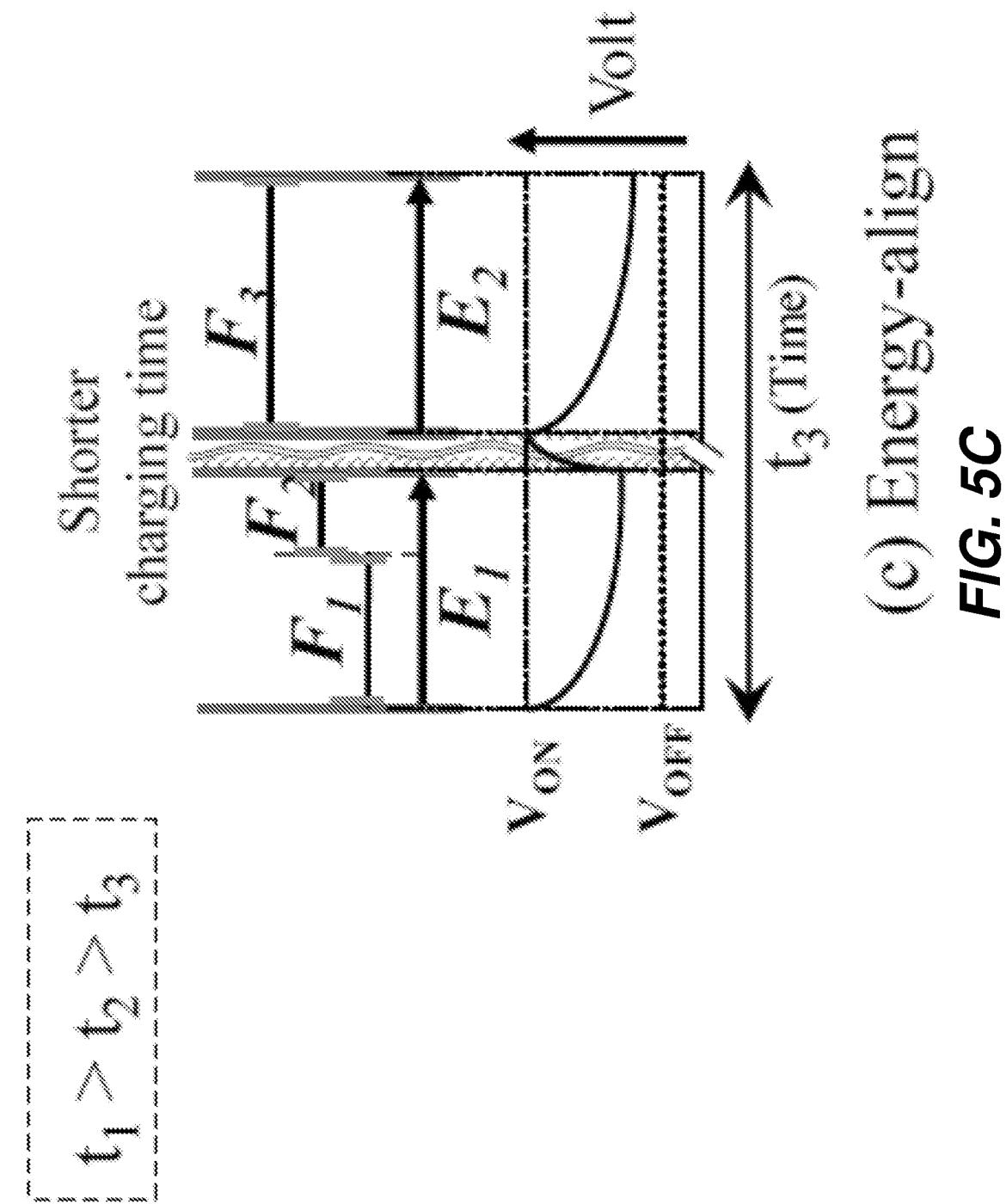
FIG. 5C depicts function-execution across power cycles for according to one embodiment of the present disclosure.
Figure 6:
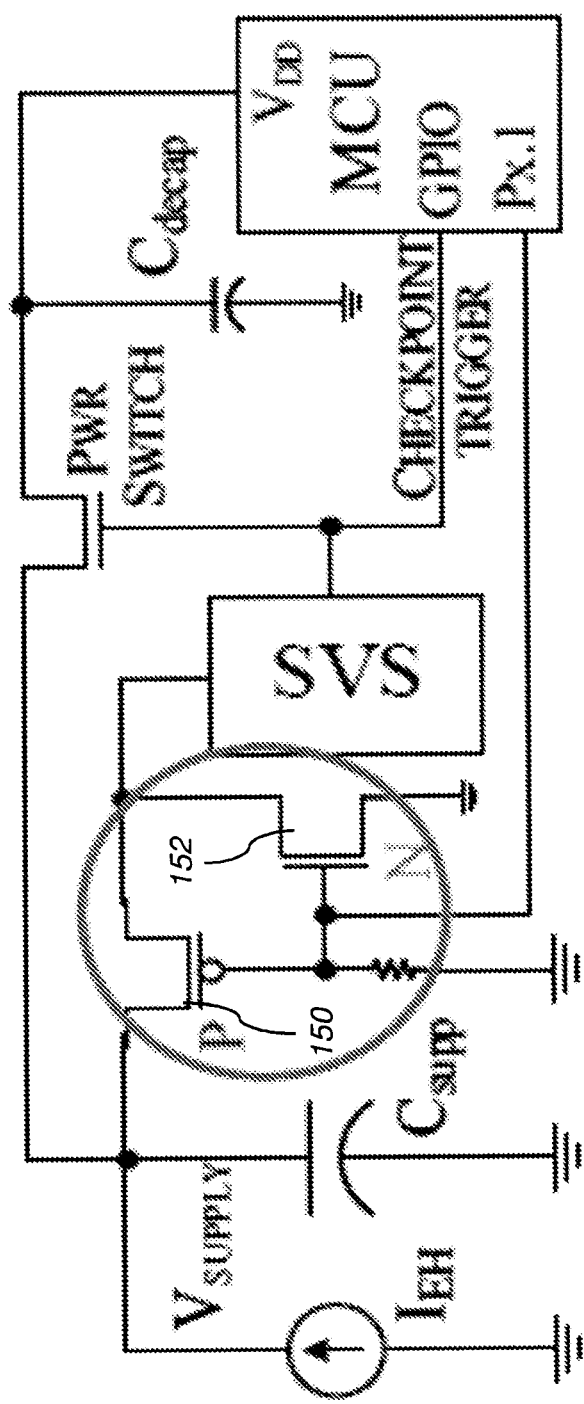
FIG. 6 depicts a modified architecture of the system of FIG. 1A according to one embodiment.

FIG. 5 shows the benefits of Energy-Align run-time process (FIG. 5C) over Quickrecall (FIG. 5A) and a lazy checkpointing system (FIG. 5B; henceforth referred to as Lazy-ckpt). The lower portion of each figure depicts the supply voltage and the top portion shows the functions $F_1$ through $F_3$ executing across power cycles. Note that the charging cycle is compressed for representation. Lazy-ckpt is assumed to have an optimal memory configuration, albeit without the capability to shut down the system to perform energy alignment. Hence, Lazy-ckpt has equal execution time as Energy-Align but incurs a significant overhead due to the conservative trigger voltage setting required for guaranteeing a successful checkpoint. As depicted in FIG. 5C, Energy-Align and Lazy-ckpt run faster than Quickrecall. Additionally, note that for Energy-Align, functions are not split across power cycles, and hence Energy-Align run-time process seldom discharges the capacitor 102 until $V_{OFF}$. When the system realizes it does not have sufficient energy for executing $F_3$, it shuts off. Since $E_1$<Ein, it results in Energy-Align run-time process having a shorter capacitor charging time. Thus, Energy-Align improves the performance and reduces the overall energy consumption of the IoT device as compared to both Lazy-ckpt and Quickrecall. To implement the Energy-Align run-time process in one example, the architecture of the edge device 100 is modified as shown in FIG. 6. Switching device 150 (P) connects capacitor 102 ($C_{supp}$) to the SVS input in a default scenario. When Energy-Align run-time process is to be performed, the MCU 101 pulls its $P_x.1$ output high, thus momentarily connecting the SVS input to ground through switching device 152 (N), which causes the power switch to be disconnected until capacitor 102 ($C_{supp}$) charges to $V_{ON}$.

Figure 7A:
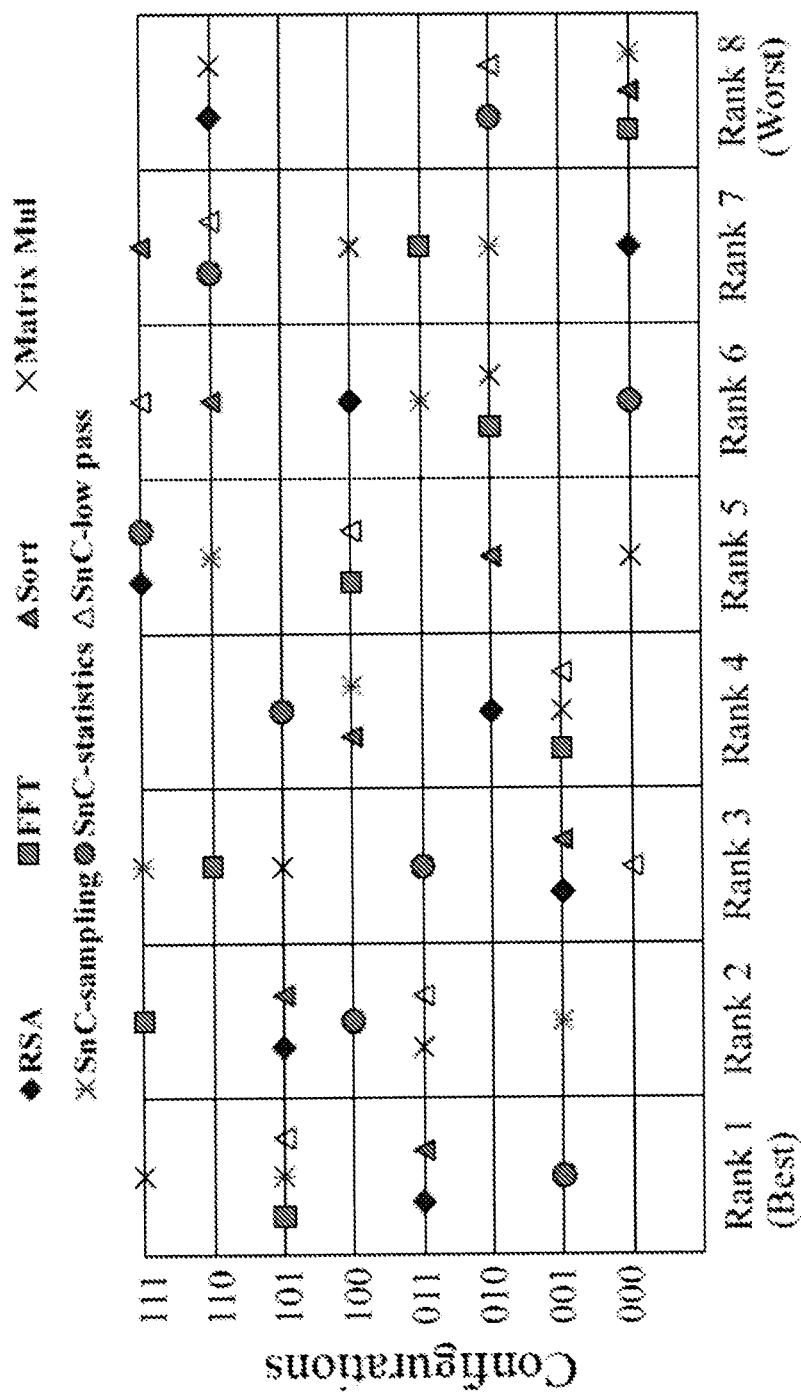
FIG. 7A depicts an experimental platforms according to one embodiment.
Figure 7B:
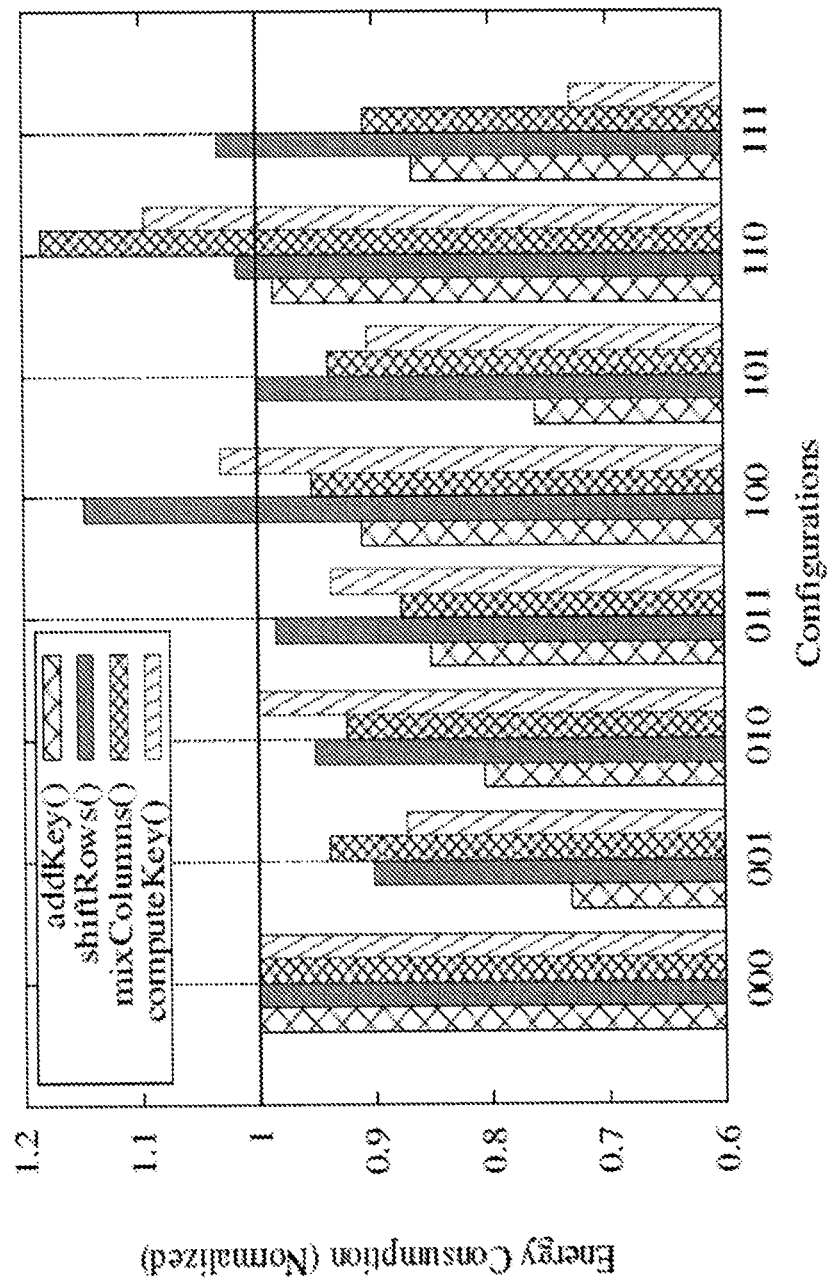
FIG. 7B depicts a measurement setup according to one embodiment.
Figure 7C:
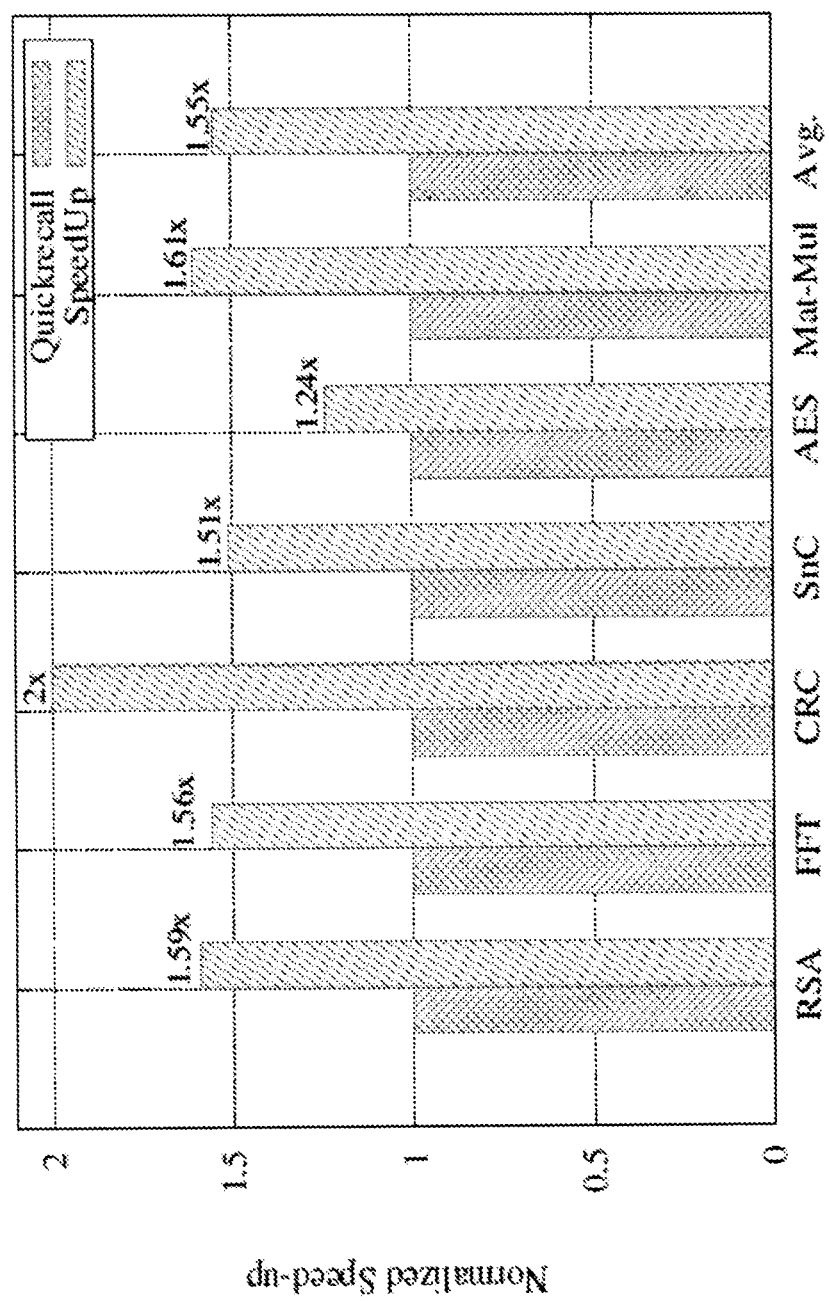

FIG. 7 shows one example system to implement the above functionality. The Texas Instruments MSP430FR5739 MCU with 16 KB of FRAM and 1 KB of SRAM was employed as the MCU. All the experiments were run with the MCU frequency set at 24 MHz. An FRAM access takes 3 clock cycles as compared to a single cycle access for SRAM. Even though the MCU has an internal SVS, we employ an external SVS to control the power switch, $V_{ON}$, and V TRIG. The $V_{ON}$ and $V_{TRIG}$ voltages are set to 2:3 V and 2:03 V respectively. Capacitor 102 (Csupp) was configured as 330 μF for initial experiments. A Tektronix 6430 Keithley source meter was used as the current supply, which acts as the energy harvesting module. The IEH is set to 400 μA for all experiments. Finally, all the latency overheads were recorded using a Tektronix MDO4104-3 oscilloscope.

For evaluation, we consider six different applications (shown in Table III) that are commonly used in IoT devices. As we mentioned above, all the applications are deterministic and do not vary in their execution times or input data sizes. Sense and Compute (SnC) utilizes interrupts from the ADC for sampling. The interrupts are deterministic in latency and hence, cause no run-to-run variation in terms of execution time. All the functions are implemented on the device with a modified boot-loader, software flow similar to Quickrecall, and a task manager that performs migration, execution, and checkpointing as required.

TABLE III

Evaluation benchmarks

| | |
|---|---|
| SnC | Sample sensor readings and perform computations |
| FFT | FFT( ): Perform FFT on sampled data |
| | Sort( ): Perform bit-reversal sorting for FFT |
| CRC | CRC( ): Compute 16-bit CRC for error detection |
| RSA | RSA( ): Encryption algorithm |
| AES | AES algorithm made up of 4 functions, namely, addKey( ), shiftRows( ), mixColumns( ), and computeKey( ) |
| MMul | matrixMultiply( ): Perform matrix mult. on sensor data |

FIG. 8A shows the energy-rank ordering of different configurations for functions in the benchmark programs. The x-axis shows the different ranks from best to worst while the y-axis shows the possible memory-map configurations. The configurations are represented in binary format as discussed above. The configurations corresponding to rank 1 denote the optimal configurations for executing the function. These are output by eM-map algorithm and used by Energy-Align. Observe that among all the different functions plotted in FIG. 8A, only matrixMultiply( ) has the preferred configuration to be all SRAM. This means that for most functions, the data transfer overhead of migrating all the sections to SRAM is not amortized by the reduction in energy consumption achieved by executing from SRAM, resulting in an optimal memory-map configuration that lies between {000} and {111}. Additionally, note that the optimal configuration for all the seven functions have the stack section to be mapped onto SRAM. This is due to the fact that the number of memory accesses to the stack is often high during the course of program execution and therefore mapping the stack section to SRAM has a significant impact on performance and energy consumption. For most functions, we observe that migrating the stack as well as just one more section of either data or text to SRAM provides the maximum energy benefits. The execution characteristics and memory access pattern of the function have a bearing on the optimal memory configuration. This is ascertained by the fact that SnC-Sampling( ) and SnC-LowPass( ) have different ranks for all the eight configurations in spite of having similar sizes for text and data sections. This is primarily due to the fact that SnC-LowPass( ) is more stack and data intensive as compared to SnC-Sampling( ) Note that SnC-Sampling( ) involves deterministic interrupts from the ADC, and the energy and latency overhead for the same is accounted during characterization by eM-map.

FIG. 8B shows the normalized energy consumption of all the configurations for the functions in the AES application. The energy consumption is normalized to configuration {000}, which corresponds to Quickrecall. Note that for some functions, migration and checkpointing of sections result in additional energy being expended than in the {000} case. For example, even though the shiftRows( ) in configuration {100} has only the text section to be migrated (and nothing to be checkpointed), the overall energy consumption increases. This is because shiftRows( ) is devoid of repetitive computational kernels such as loops and hence, the cost of migration is not amortized by the reduction in execution energy. In fact, migration of the text section involves a read of each of the bytes in the text section from FRAM, which is equivalent to executing the code once from FRAM. Therefore, migrating the code to SRAM and then executing it is wasteful. For this reason, shiftRows( ) has the least energy benefit in its preferred configuration among the four AES functions. Note that the optimal configuration for the functions have stack in SRAM, which concurs with our earlier observation. Overall, for the AES application, our proposed solution reduces energy consumption by 20% as compared to Quickrecall. Across applications, we observe that the average energy reduction achieved is 44%, as shown in FIG. 9.

Energy measurement is an integral component in both eMmap and Energy-Align. This is achieved by a measurement of the supply voltage using the ADC that consumes <5 μJ of energy and 950 μs of latency per measurement. As FIG. 8C shows, this overhead is negligible as compared to the improvement in overall performance and reduction in energy consumption achieved by Energy-Align process 160. FIG. 8C shows the execution times of different IoT applications normalized to Quickrecall for a single run of the application across power cycles. The execution time includes the time required by the capacitor 102 to regain charge and switch-on the system. As is evident, the energy-aware memory-mapped solution has better performance (as much as 2×) as compared to Quickrecall. The speed-up stems from the reduction in execution time achieved by energy-efficient memory mapping of sections by eM-map and also from the reduction in charging time achieved by Energy-Align process 160. Note that, even if two applications have the same overall migration overhead and optimal configurations, the unique characteristics of function-execution and memory access patterns result in different speed-ups for each of them.

To show that eM-map is agnostic to system parameters, we learn the preferred configuration for FFT-Sort( ) with Csupp set to 180 μF. Results of the experiment are shown in Table IV. Most of the configurations fail to execute successfully in a single power cycle in the new system rendering them invalid. eM-map assigns the last outstanding rank to {000} even though it returns invalid. Finally, we note that the memory map configuration output by eM-map is agnostic to any input power trace variation. As mentioned above, the device architecture ensures the amount of available energy at the beginning of each power cycle. Any variations in the input power will only impact the amount of time the device spends in charging capacitor 102 (Csupp).

TABLE IV

Rank order of configurations for the FFT-Sort

| | $C_{supply}$ | | | | | | | |
|---|---|---|---|---|---|---|---|---|
| | 000 | 001 | 010 | 011 | 100 | 101 | 110 | 111 |
| 330 μF | 8 | 3 | 5 | 1 | 4 | 2 | 6 | 7 |
| 180 μF | 4 | 3 | N.V. | 1 | N.V. | 2 | N.V. | N.V. | benchmark using two different $C_{supply}$ (N.V. = not valid)

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. A microcontroller system, comprising:
a) a processor;
b) a first memory section operatively connected to the processor; and
c) a second memory section operatively connected to the processor, the second memory section comprising a physical memory type different from the first memory section, the processor configured to perform a checkpoint operation which, upon a detected upcoming power loss event, copies different portions of an executable program to the first memory section and the second memory section, wherein the second memory section comprises a temporary memory section for storing a function data and a function stack.

2. A microcontroller system, comprising: a) a processor; b) a first memory section operatively connected to the processor; and c) a second memory section operatively connected to the processor, the second memory section comprising a physical memory type different from the first memory section, the processor configured to perform a checkpoint operation which, upon a detected upcoming power loss event, copies different portions of an executable program to the first memory section and the second memory section, wherein the second memory section further comprises a persistent memory section for storing a function text, the persistent memory section being separate from a temporary memory section of the second memory section storing a function data and a function stack.

3. A microcontroller system, comprising: a) a processor; b) a first memory section operatively connected to the processor; and c) a second memory section operatively connected to the processor, the second memory section comprising a physical memory type different from the first memory section, the processor configured to perform a checkpoint operation which, upon a detected upcoming power loss event, copies different portions of an executable program to the first memory section and the second memory section, wherein the processor is configured to determine an optimal placement of function data, function stack, and function text information within the first and second memory sections for functions of the program.

4. A microcontroller system, comprising:
a) a processor;
b) a first memory section operatively connected to the processor; and
c) a second memory section operatively connected to the processor, the second memory section comprising a physical memory type different from the first memory section, the processor configured to perform a checkpoint operation which, upon a detected upcoming power loss event, copies different portions of an executable program to the first memory section and the second memory section, wherein the processor is configured to allow the execution of function in the program flow only if the system has sufficient energy to complete it.

* * * * *